(12) United States Patent
Howald et al.

(10) Patent No.: US 9,831,071 B2
(45) Date of Patent: Nov. 28, 2017

(54) SYSTEMS AND METHODS FOR USING MULTIPLE INDUCTIVE AND CAPACITIVE FIXTURES FOR APPLYING A VARIETY OF PLASMA CONDITIONS TO DETERMINE A MATCH NETWORK MODEL

(71) Applicant: Lam Research Corporation, Fremont, CA (US)

(72) Inventors: Arthur M. Howald, Livermore, CA (US); John C. Valcore, Jr., Fremont, CA (US)

(73) Assignee: Lam Research Corporation, Fremont, CA (US)

(*) Notice: Subject to any disclaimer, the term of this patent is extended or adjusted under 35 U.S.C. 154(b) by 8 days.

(21) Appl. No.: 15/059,778

(22) Filed: Mar. 3, 2016

(65) Prior Publication Data

US 2016/0240356 A1    Aug. 18, 2016

Related U.S. Application Data

(63) Continuation-in-part of application No. 14/716,797, filed on May 19, 2015, and a continuation-in-part of application No. 14/245,803, filed on Apr. 4, 2014.

(60) Provisional application No. 61/821,523, filed on May 9, 2013.

(51) Int. Cl.
*H01J 37/32* (2006.01)
*G01R 17/00* (2006.01)

(52) U.S. Cl.
CPC ........ *H01J 37/32926* (2013.01); *G01R 17/00* (2013.01); *H01J 37/32091* (2013.01); *H01J 37/32183* (2013.01)

(58) Field of Classification Search
CPC .......... H01J 37/32926; H01J 37/32183; H01J 37/32091; G01R 17/00
See application file for complete search history.

(56) References Cited

U.S. PATENT DOCUMENTS

| | | | | |
|---|---|---|---|---|
| 4,498,045 A | * | 2/1985 | Dworsky | G01B 7/063 324/71.5 |
| 4,501,949 A | | 2/1985 | Antol et al. | |
| 5,187,454 A | * | 2/1993 | Collins | H03H 11/30 333/17.3 |
| 6,077,386 A | | 6/2000 | Smith, Jr. et al. | |
| 6,090,302 A | | 7/2000 | Smith, Jr. et al. | |
| 6,123,983 A | | 9/2000 | Smith, Jr. et al. | |
| 6,134,005 A | | 10/2000 | Smith, Jr. et al. | |
| 6,192,826 B1 | | 2/2001 | Smith, Jr. et al. | |
| 6,223,755 B1 | | 5/2001 | Smith, Jr. et al. | |
| 6,246,473 B1 | | 6/2001 | Smith, Jr. et al. | |
| 6,254,717 B1 | | 7/2001 | Smith, Jr. et al. | |
| 6,269,278 B1 | | 7/2001 | Smith, Jr. et al. | |
| 6,275,740 B1 | | 8/2001 | Smith, Jr. et al. | |
| 6,291,361 B1 | | 9/2001 | Hsia et al. | |

(Continued)

*Primary Examiner* — Patrick Assouad
*Assistant Examiner* — Haidong Zhang
(74) *Attorney, Agent, or Firm* — Martine Penilla Group, LLP

(57) ABSTRACT

Systems and methods for using multiple inductive and capacitive fixtures for applying a variety of plasma conditions to determine fixed parameters of a match network model are described. The multiple fixtures mimic various plasma conditions without occupying tool time in which a wafer is placed within a plasma chamber to generate the fixed parameters of the match network model.

18 Claims, 7 Drawing Sheets

(56) References Cited

U.S. PATENT DOCUMENTS

| | | |
|---|---|---|
| 6,701,202 B2 | 3/2004 | Nakano et al. |
| 6,795,796 B2 | 9/2004 | Nakano et al. |
| 6,805,810 B2 | 10/2004 | Smith, Jr. et al. |
| 6,806,438 B2 * | 10/2004 | Nakano ............... C23C 16/5096 219/121.54 |
| 6,830,650 B2 | 12/2004 | Roche et al. |
| 6,871,111 B2 | 3/2005 | Nakano et al. |
| 7,120,556 B2 | 10/2006 | Nakano et al. |
| 7,192,505 B2 | 3/2007 | Roche et al. |
| 7,225,754 B2 | 6/2007 | Nakano et al. |
| 7,435,926 B2 | 10/2008 | Jafarian-Tehrani |
| 7,758,718 B1 | 7/2010 | Dine |
| 7,908,115 B2 | 3/2011 | Matlis et al. |
| 8,185,349 B2 | 5/2012 | Matlis et al. |
| 8,206,604 B2 | 6/2012 | Dine |
| 8,969,841 B2 | 3/2015 | Smith |
| 2002/0038688 A1 | 4/2002 | Nakano et al. |
| 2003/0029720 A1 | 2/2003 | Smith, Jr. et al. |
| 2003/0136663 A1 | 7/2003 | Smith, Jr. et al. |
| 2004/0060660 A1 * | 4/2004 | Klimecky ............. H01J 37/321 156/345.28 |
| 2005/0061443 A1 | 3/2005 | Nakano et al. |
| 2006/0180570 A1 | 8/2006 | Mahoney |
| 2015/0267727 A1 | 9/2015 | Segawa et al. |

* cited by examiner

SYSTEMS AND METHODS FOR USING MULTIPLE INDUCTIVE AND CAPACITIVE FIXTURES FOR APPLYING A VARIETY OF PLASMA CONDITIONS TO DETERMINE A MATCH NETWORK MODEL

CLAIM OF PRIORITY

This application is a continuation-in-part of and claims the benefit, under 35 U.S.C. §120, of co-pending U.S. patent application Ser. No. 14/716,797, filed on May 19, 2015, and entitled "SYSTEMS AND METHODS FOR PROVIDING CHARACTERISTICS OF AN IMPEDANCE MATCHING MODEL FOR USE WITH MATCHING NETWORKS", which is incorporated by reference herein in its entirety.

This application is a continuation-in-part of and claims the benefit, under 35 U.S.C. §120, of co-pending U.S. patent application Ser. No. 14/245,803, filed on Apr. 4, 2014, and entitled "SEGMENTING A MODEL WITHIN A PLASMA SYSTEM", which is incorporated by reference herein in its entirety.

The U.S. patent application Ser. No. 14/245,803, filed on Apr. 4, 2014, and titled "SEGMENTING A MODEL WITHIN A PLASMA SYSTEM", claims priority, under 35 U.S.C. §119(e), to U.S. provisional patent application No. 61/821,523, filed on May 9, 2013, and titled "SEGMENTING A MODEL WITHIN A PLASMA SYSTEM".

FIELD

The present embodiments relate to systems and methods for using multiple inductive and capacitive fixtures for applying a variety of plasma conditions to determine a match network model.

BACKGROUND

Plasma systems are used to control plasma processes. A plasma system includes multiple radio frequency (RF) sources, an impedance match, and a plasma reactor. A workpiece is placed inside the plasma chamber and plasma is generated within the plasma chamber to process the workpiece. It is important that the workpiece be processed in a similar or uniform manner independent of replacement or use of one part of the plasma system with another. For example, when a part of the plasma system is replaced with another part, the workpiece is processed differently.

It is in this context that embodiments described in the present disclosure arise.

SUMMARY

Embodiments of the disclosure provide apparatus, methods and computer programs for using multiple inductive and capacitive fixtures for applying a variety of plasma conditions to determine a match network model. It should be appreciated that the present embodiments can be implemented in numerous ways, e.g., a process, an apparatus, a system, a piece of hardware, or a method on a computer-readable medium. Several embodiments are described below.

A radio frequency (RF) match network model is a mathematical representation or a computer representation of a physical impedance matching network and is used to predict RF properties, e.g., current, voltage, and phase, etc., at an output of the impedance matching network from measurement of the RF properties at an input of the impedance matching network. As a starting point, the match network model has a modular form including various modules. Examples of the modules are provided in the patent application having application Ser. No. 14/245,803. Each module includes one or more circuit elements. Values of the circuit elements in the modules are based on known values of inductance and capacitance from a schematic of the impedance matching network and on approximations of some physical quantities, such as, an inductance of connecting straps that are not included in the schematic. The starting point of the match network model is improved by making a set of experimental measurements and adjusting the values of the circuit elements to provide a fit between the measurements and predictions of the match network model. One way to obtain the experimental measurements is to use wafers in a plasma tool. During an on-tool measurement, a high-accuracy RF voltage and current probe is temporarily installed at the output of the impedance matching network implemented in the plasma tool to run a variety of plasma recipes and record measured RF voltage and current at the output of the impedance matching network for each recipe, and vary the values of the circuit elements in the modules of the match network model to provide a fit between the measurements and the predictions.

However, the on-tool measurement is time-consuming in that tool time of using the plasma tool is occupied. By using the high-accuracy RF voltage and current probe, baseline values of the match network model are generated for each impedance matching network. However, each individual matching network, which has a specific serial number and a model number, is slightly different from any other individual matching network, which has another serial number and the same model number. The use of the high-accuracy RF voltage and current probe is performed on about a half dozen individual matching networks, which takes a few weeks.

To make the baseline values more specific, instead of using the on-tool measurement, an S11 measurement is obtained for each matching network. Such use of the S11 measurement is described in the patent application having application Ser. No. 14/716,797. This S11 measurement is obtained by attaching a physical test fixture, sometimes referred to herein as a load impedance fixture, to the output of the impedance matching network under test and by using a network analyzer to obtain a measurement at the input of the impedance matching network. The load impedance fixture is designed to have an impedance the same as one of multiple plasma conditions so the measurement by the network analyzer mimics one of many on-tool tests. The match network model is adjusted for the impedance matching network based on the measurement obtained using the load impedance fixture to generate a result more accurate than the baseline values applied to the impedance matching networks of the same model.

In some embodiments, a set of multiple bench-top fixtures, sometimes referred to herein as load impedance fixtures, are used to mimic a multiple number of on-tool plasma conditions to obtain multiple network analyzer measurements. The multiple network analyzer measurements with the multiple bench-top fixtures are used to create the baseline values of the match network model without having to run wafers on the plasma tool with plasma, which saves time associated with use of the on-line tool and resources of the on-line tool. The multiple bench-top fixtures are inexpensive. The multiple bench-top fixtures are built from a combination of a resistor, or a capacitor, or an inductor, or a cable, or a combination of two or more thereof. For example, one of the fixtures includes a resistor and a variable length coaxial cable. Each of the multiple bench-top fixtures is connected to the output of the impedance matching network consecutively, and network analyzer measurements of an impedance at the input of the matching network at one or more values of a combined variable capacitance of the impedance matching network and an RF frequency are obtained. Values of the circuit elements of the match network model are optimized to obtain an agreement between the network analyzer measurements and predicted values generated from the network analyzer measurements without using plasma.

In various embodiments, a method for using multiple fixtures for applying a variety of plasma conditions to determine fixed parameters of a match network model is described. The method includes receiving a first output impedance measured at an input of a first fixture and receiving a first input impedance measured at an input of an impedance matching network. The first measured input impedance is measured for a first variable capacitance of the impedance matching network when the input of the impedance matching network is connected to an output of a network analyzer operating at a first frequency and an output of the impedance matching network is connected to an input of a first fixture. The method includes determining whether the first measured input impedance is within a predetermined threshold of a predetermined impedance and storing the first frequency and the first variable capacitance upon determining that the first measured input impedance is within the predetermined threshold of the predetermined impedance. The method includes receiving a second output impedance measured at an input of a second fixture and receiving a second input impedance measured at the input of the impedance matching network. The second measured input impedance is measured for a second variable capacitance of the impedance matching network when the input of the impedance matching network is connected to the output of the network analyzer operating at a second frequency and the output of the impedance matching network is connected to an input of a second fixture. The method includes determining whether the second measured input impedance is within the predetermined threshold of the predetermined impedance and storing the second frequency and the second variable capacitance upon determining that the second measured input impedance is within the predetermined threshold of the predetermined impedance. The method includes applying the first measured output impedance at an output of a match network model to calculate a first predicted input impedance at an input of the match network model when the match network model is assigned the first frequency, the first variable capacitance, a first fixed inductance, a first fixed capacitance, and a first fixed resistance. The method includes applying the second measured output impedance at the output of the match network model to calculate a second predicted input impedance at the input of the match network model when the match network model is assigned the second frequency, the second variable capacitance, the first fixed inductance, the first fixed capacitance, and the first fixed resistance. The method includes determining whether the first predicted input impedance is within a predetermined range from the first measured input impedance and whether the second predicted input impedance is within the predetermined range from the second measured input impedance. The method includes assigning the first fixed inductance, the first fixed capacitance, and the first fixed resistance to the match network model upon determining that the first predicted input impedance is within the predetermined range from the first measured input impedance and that the second predicted input impedance is within the predetermined range from the second measured input impedance.

Some advantages of the herein described systems and methods include that the match network model is created and checked on a test bench, without having to use wafers and tool time. Additional advantages of the herein described systems and methods include covering a wide range of plasma conditions using the multiple fixtures than that covered using actual different recipes in the plasma tool. The match network model, when created using the plasma tool, is accurate for a range of variable capacitances of the impedance matching network and RF frequencies for which test wafers are processed. When a new process in the future uses a different variable capacitance or a different RF frequency, the match network model will not be as accurate for the different variable capacitance and the different RF frequency. By using the multiple fixtures, a wide range of plasma conditions are mimicked, and therefore the match network model is generated to be used with a large range of plasma conditions. Also, the multiple fixtures are relatively inexpensive to fabricate.

Some variable capacitors used the impedance matching network have a wobble, which is a periodic variation of a capacitance of the variable capacitors value versus motor counts from an ideal straight line. The variable capacitors limit an accuracy of the match network model. For a large number of matching networks having the same model number for which the match network model is used, a large number of S11 measurements made with the multiple fixtures are used to correct the wobble for every matching network.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe systems and methods for using multiple inductive and capacitive fixtures for applying a variety of plasma conditions to determine a match network model. It will be apparent that the present embodiments may be practiced without some or all of these specific details. In other instances, well known process operations have not been described in detail in order not to unnecessarily obscure the present embodiments.

Multiple fixtures are used in the systems to calculate measured values of impedances at an input of an impedance matching network, which has a serial number and a model number. The measured values are compared with predicted values, which are calculated at an input of the match network model of the impedance matching network. The comparison is used to determine fixed values, e.g., resistor values, capacitance values, inductance values, etc., of the match network model. The fixed values are used to calculate a parameter at an output of the match network model when multiple impedance matching networks of the model number but having different serial numbers are used to process a wafer. Use of the multiple fixtures saves on-tool time. Also, the multiple fixtures are inexpensive to fabricate and mimic a wide variety of plasma conditions.

Figure 1A:
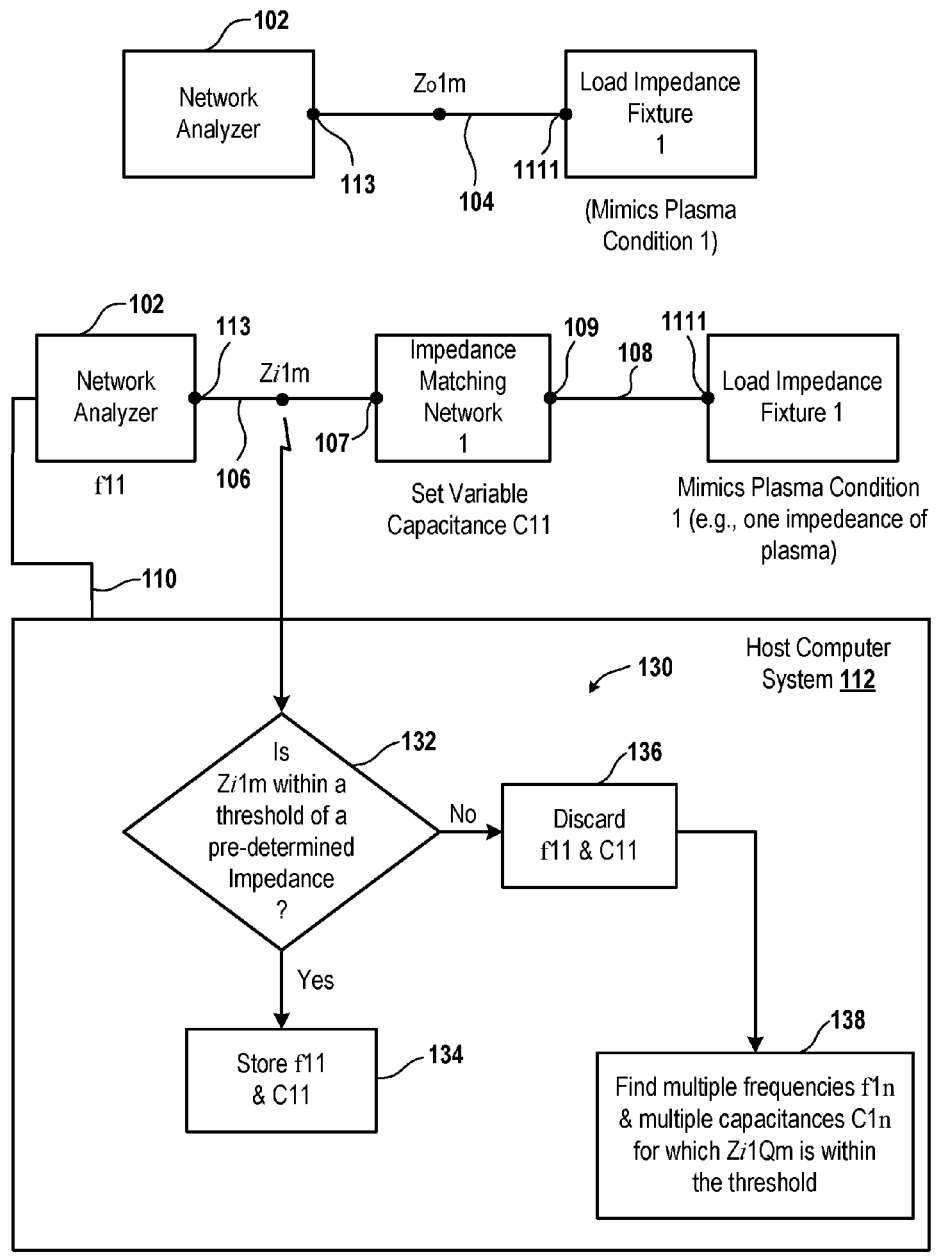
FIG. 1A is a diagram to illustrate determination of one or more variable frequencies of a network analyzer connected to a load impedance fixture 1 and determination of one or more variable capacitances of an impedance matching network 1 for use of the one or more variable frequencies and the one or more variable capacitances in a match network model.

FIG. 1A is a diagram to illustrate a determination of one or more variable frequencies of a network analyzer 102 connected to a load impedance fixture 1 and of one or more variable capacitances of an impedance matching network 1 for use of the one or more variable frequencies and the one or more variable capacitances in a match network model. In some embodiments, the network analyzer 102 is a measurement device for measuring s-parameters of electrical networks that are connected to the network analyzer 102. For example, the network analyzer 102 measures reflection and transmission parameters, e.g., impedance, reflection coefficient, voltage standing wave ratio, etc., of the electrical networks. In several embodiments, the network analyzer 102 includes a signal generator, one or more sensors, and a display screen. The signal generator generates an RF signal, the one or more sensors sense an s-parameter, and the display screen displays the s-parameter.

The network analyzer 102 is connected at its output 113 to an input 1111 of the load impedance fixture 1 via a radio frequency (RF) cable 104. The load impedance fixture 1 has an impedance that represents a plasma condition, e.g., an impedance within a plasma chamber, etc. The network analyzer 102 generates the RF signal having a frequency f11 and provides the RF signal to the load impedance fixture 1 via the output 113, the RF cable 104, and the input 1111. When the RF signal having the frequency f11 is provided to the load impedance fixture 1, a load impedance Zo1$m$ is measured at the input 1111 of the load impedance fixture 1.

The network analyzer 102 is disconnected from the load impedance fixture 1 and then connected at its output 113 to an input 107 of a branch circuit of an impedance matching network 1 via a radio frequency (RF) cable 106. For example, the branch circuit is to be connected to an x megahertz (MHz) RF generator or to a y MHz RF generator or to a z MHz RF generator during processing of a wafer. The branch circuit is one of multiple branch circuits in case multiple RF generators are used. For example, when x and y MHz RF generators are used, two branch circuits are implemented within the impedance matching network 1. One of the two branch circuits has an input that is connected to an output of the x MHz RF generator and another one of the two branch circuits has an input connected to an output of the y MHz RF generator. Outputs of the two branch circuits are connected with each other and are to be connected to an RF transmission line or to a load impedance fixture. In some embodiments, an example of the x MHz RF generator includes a 2 MHz RF generator, an example of the y MHz RF generator includes a 27 MHz RF generator, and an example of the z MHz RF generator includes a 60 MHz RF generator. In various embodiments, an example of the x MHz RF generator includes a 400 kHz RF generator, an example of the y MHz RF generator includes a 27 MHz RF generator, and an example of the z MHz RF generator includes a 60 MHz RF generator.

Each branch circuit of the impedance matching network 1 includes one or more inductors, or one or more capacitors, or one or more resistors, or a combination thereof. For example, a branch circuit of the impedance matching network 1 includes a series circuit that includes an inductor coupled in series with a capacitor. The branch circuit of the impedance matching network 1 further includes a shunt circuit connected to the series circuit. The shunt circuit includes a capacitor connected in series with an inductor. The branch circuit of the impedance matching network 1 includes one or more capacitors and corresponding capacitances of the one or more capacitors are variable, e.g., are varied using a drive assembly, etc. For example, a processor of the host computer system 112 sends a signal to the drive assembly to change a distance between two parallel plates of a variable capacitor of the impedance matching network 1 to further change a capacitance of the variable capacitor to achieve a capacitance. A combined variable capacitance of the one or more variable capacitors of the impedance matching network 1 is set to a value C11. For example, positions of corresponding oppositely-located plates of the one or more variable capacitors are adjusted to set the variable capacitance C11. To illustrate, the combined capacitance of two or more capacitors that are connected to each other in parallel is a sum of capacitances of the capacitors. As another illustration, the combined capacitance of two or more capacitors that are connected to each other in series is an inverse of a sum of inverses of capacitances of the capacitors. An example of an impedance matching network 1 is provided in patent application having application Ser. No. 14/716,797.

The impedance matching network 1 is also connected at its output 109, which is an output of the branch circuit, to an input 1111 of a load impedance fixture 1 via an RF cable 108. The branch circuit is connected at the input 107 to the output 113. Moreover, the combined variable capacitance of the impedance matching network 1 is set to the value C11. The load impedance fixture 1 has an impedance that represents a plasma condition, e.g., an impedance within a plasma chamber, etc. The network analyzer 102 generates an RF signal having the frequency f11 and provides the RF signal to the impedance matching network 1 via the RF cable 106 via the output 113 and the input 107. The impedance matching network 1 matches an impedance of a load connected to the impedance matching network 1 with that of a source connected to the impedance matching network 1 to generate a modified signal, which is an RF signal. Examples of the load include the load impedance fixture 1 and of the source include the network analyzer 102. The modified signal is provided from the impedance matching network 1 to the load impedance fixture 1 via the output 109 and the input 1111. When the RF signal is supplied by the network analyzer 102 via the RF cable 106 to the impedance matching network 1 that has the combined variable capacitance C11, an input impedance Zi1m at the input 107 of the impedance matching network 1 is measured by the network analyzer 102. An impedance, as used herein, is a complex value. For example, an impedance Z is a complex value R+jX, where R is a resistance, X is a reactance, and j is a complex number.

The network analyzer 102 is connected via a network cable 110 to a host computer system 112, which includes a processor and a memory device. Examples of the host computer system 112 include a laptop computer or a desktop computer or a tablet or a smart phone, etc. As used herein, instead of the processor, a central processing unit (CPU), a controller, an application specific integrated circuit (ASIC), or a programmable logic device (PLD) is used, and these terms are used interchangeably herein. Examples of a memory device include a read-only memory (ROM), a random access memory (RAM), a hard disk, a volatile memory, a non-volatile memory, a redundant array of storage disks, a Flash memory, etc. Examples of a network cable, as used herein, is a cable used to transfer data in a serial manner, or in a parallel manner, or using a Universal Serial Bus (USB) protocol, etc.

The processor of the host computer system 112 receives the measured input impedance Zi1m from the network analyzer 102 via the network cable 110. The processor determines, in an operation 132 of a method 130, whether the measured input impedance Zi1m is within a pre-determined threshold of a pre-determined impedance, e.g., 50 ohms, 55 ohms, 60 ohms, an impedance between 45 and 50 ohms, etc. In some embodiments, the pre-determined threshold and the pre-determined impedance are received as an input by the processor from a user via an input device, which is further described below, and stored by the processor within the memory device of the host computer system 112. The pre-determined threshold and the pre-determined impedance are received by the processor before a time at which an input impedance, e.g., Zi1m, etc., is measured by the network analyzer 102. Upon determining that the measured input impedance Zi1m is within the pre-determined threshold of the pre-determined impedance, the processor stores, in an operation 134 of the method 130, the frequency f11 and the variable capacitance C11 within the memory device of the host computer system 112.

On the other hand, upon determining that the measured input impedance Zi1m is not within the pre-determined threshold of the pre-determined impedance, the processor determines, in an operation 136 of the method 130, to discard the frequency f11 and the variable capacitance C11. For example, the processor does not store the frequency f11 and the variable capacitance C11 in the memory device of the host computer system 112. As another example, the processor erases the frequency f11 and the variable capacitance C11 from the memory device.

In some embodiments, instead of discarding the frequency f11 and the variable capacitance C11, a pre-determined weight is assigned by the processor to the frequency f11 to generate a weighted frequency fw11 and a pre-determined weight is assigned by the processor to the variable capacitance C11 to generate a weighted capacitance Cw11, and a sum Sf1 of the weighted frequency fw11 and another weighted frequency fww11 and a sum Sc1 of the weighted capacitance Cw11 and another weighted capacitance Cww11 are used by the processor below. A lower amount of weight is assigned to the capacitance C11 than to another capacitance Co11 and a lower amount of weight is assigned to the frequency f11 compared to another frequency fo11. The other weighted capacitance Cww11 is generated by the processor by assigning a weight to the other capacitance Co11 and the other weighted frequency fww11 is generated by the processor by assigning a weight to the other frequency fo11. The other frequency fo11 and the other weighted capacitance Co11 are ones for which a measured impedance at the input 107 of the impedance matching network 1 is within the threshold of the pre-determined impedance.

Upon discarding the frequency f11 and the variable capacitance C11, an operation 138 of the method 130 is performed. For example, a frequency of the RF signal generated by the network analyzer 102 is modified, e.g., from f11 to f12, f12 to f13, etc., and/or a variable combined capacitance of the impedance matching network 1 is modified, e.g., from C11 to C12, from C12 to C13, etc., so that an input impedance Zi1Qm, measured at the input 107 of the impedance matching network 1, is within the pre-determined threshold of the pre-determined impedance, where Q is an integer greater than zero. For example, the network analyzer 1 changes a frequency of the RF signal from f11 to f12, and the variable capacitance C11 is not changed. The input impedance Zi1Qm measured by the network analyzer 102 is within the pre-determined threshold of the pre-determined impedance. The processor stores the frequency f12 and the variable capacitance C11 within the memory device. As another example, the variable capacitance C11 of the impedance matching network 1 is changed from C11 to C12. For example, the drive assembly controls plates of a variable capacitor of the impedance matching network 1 to modify the variable capacitance of the variable capacitor so that the combined variable capacitance of all variable capacitors of the impedance matching network 1 is C12. When the network analyzer supplies the RF signal having the frequency f11 to the impedance matching network 1, the network analyzer measures the impedance Zi1Qm at the input 107 of the impedance matching network 1 and the processor determines that the impedance Zi1Qm is within the pre-determined threshold from the pre-determined impedance. The frequency f11 and the variable capacitance C12 are stored in the memory device. In this manner, multiple frequencies f1n and multiple capacitances C1n are calculated and stored in the memory device, where n is an integer greater than zero, for which the impedance Zi1Qm is within the pre-determined threshold.

Figure 1B:
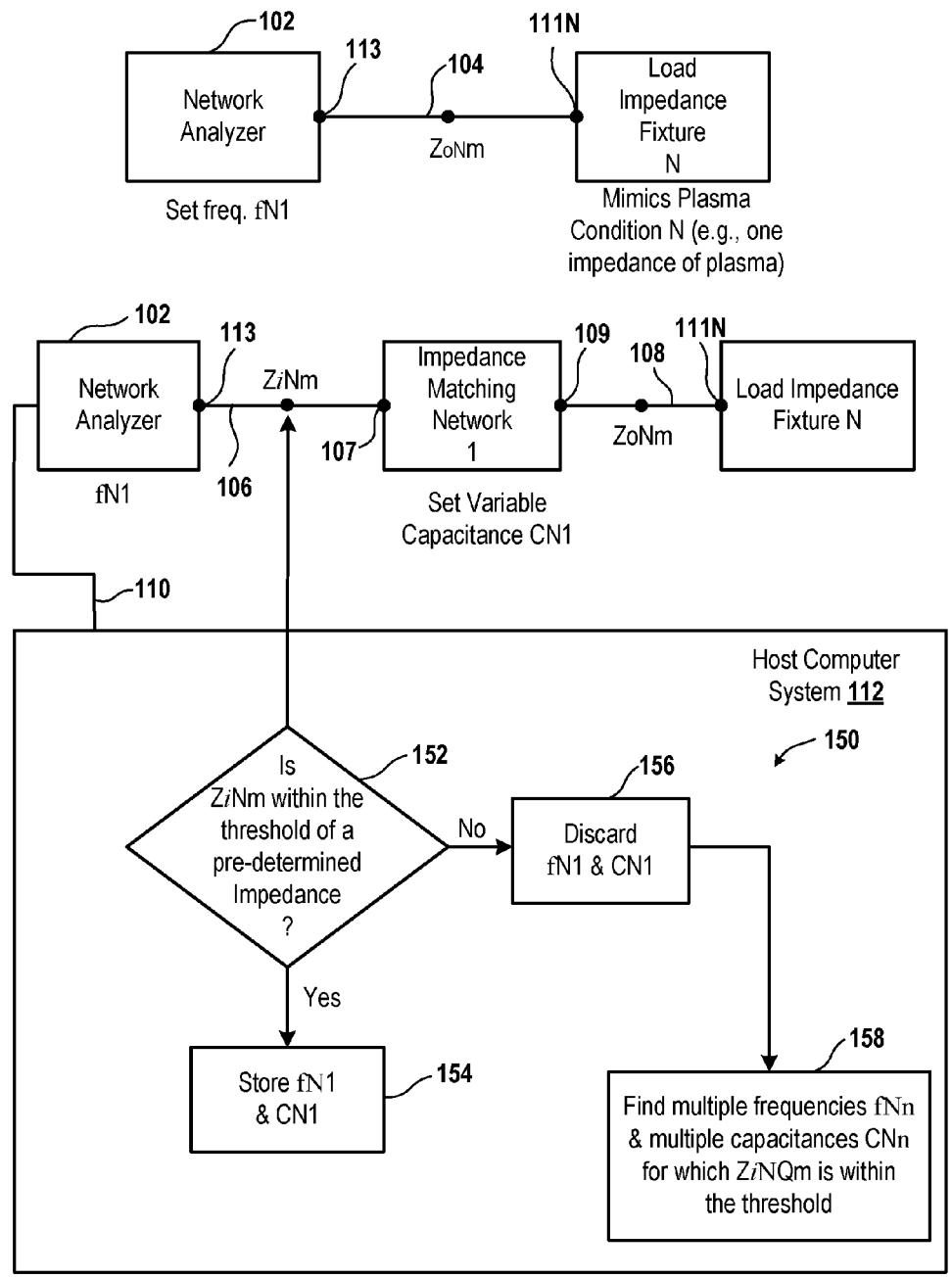
FIG. 1B is a diagram to illustrate determination of one or more variable frequencies of the network analyzer that is connected to a load impedance fixture N and determination of one or more variable capacitances of the impedance matching network 1 for use of the one or more variable frequencies and the one or more variable capacitances in the match network model.

FIG. 1B is a diagram to illustrate determination of one or more variable frequencies of the network analyzer 102 that is connected to a load impedance fixture N and of one or more variable capacitances of the impedance matching network 1 for use of the one or more variable frequencies and the one or more variable capacitances in the match network model, where N is an integer greater than 1. The network analyzer 102 is disconnected from the load impedance fixture 1 and connected at its output 113 to an input 111N of the load impedance fixture N via the RF cable 104. The load impedance fixture N has an impedance that represents a plasma condition and the plasma condition is different from the plasma condition represented by the load impedance fixture 1. For example, the load impedance fixture N has a different impedance than an impedance of the load impedance fixture 1. The network analyzer 102 generates an RF signal having a frequency fN1 and provides the RF signal to the load impedance fixture N via the output 113, the RF cable 104, and the input 111N. When the RF signal is provided to the load impedance fixture N, a load impedance ZoNm is measured at the input 111N of the load impedance fixture N.

It should be noted that the values Zo1m and ZoNm are not constant values. For example, the value Zo1m changes with an RF frequency of operation of the load impedance fixture 1 and the value ZoNm changes with an RF frequency of operation of the load impedance fixture N.

The network analyzer 102 is disconnected from the load impedance fixture 1 and is connected to the input 107 of the branch circuit of the impedance matching network 1 via the RF cable 106, and the output 109 of the branch circuit is connected to the input 111N of the load impedance fixture N via the RF cable 108. The load impedance fixture N has an impedance that represents a plasma condition and the plasma condition is different from the plasma condition represented by the load impedance fixture 1. For example, the load impedance fixture N has a different impedance than an impedance of the load impedance fixture 1.

A combined variable capacitance of the one or more variable capacitors of the impedance matching network 1 is adjusted via the drive assembly to achieve a value CN1. The network analyzer 102 generates an RF signal having the frequency fN1 and provides the RF signal via the output 113 and the input 107 to the impedance matching network 1 via the RF cable 106. The impedance matching network 1 matches an impedance of a load connected to the impedance matching network 1 with that of a source connected to the impedance matching network 1 to generate a modified signal, which is an RF signal. Examples of the load include the load impedance fixture N and of the source include the network analyzer 102. The modified signal is provided from the impedance matching network 1 via the output 109 and the input 111N to the load impedance fixture N. When the RF signal having the frequency fN1 is supplied by the network analyzer 102 via the RF cable 106 to the branch circuit of the impedance matching network 1 and the combined variable capacitance of the impedance matching network is CN1, an input impedance ZiNm is measured at the input 107 of the impedance matching network 1.

The processor of the host computer system 112 receives the measured input impedance ZiNm from the network analyzer 102 via the network cable 110. The processor determines, in an operation 152 of a method 150, whether the measured input impedance ZiNm is within the pre-determined threshold of the pre-determined impedance. Upon determining that the measured input impedance ZiNm is within the pre-determined threshold of the pre-determined impedance, the processor, in an operation 154 of the method 150, stores the frequency fN1 and the variable capacitance CN1 within the memory device of the host computer system.

On the other hand, upon determining that the measured input impedance ZiNm is not within the pre-determined threshold of the pre-determined impedance, the processor determines, in an operation 156 of the method 150, to discard the frequency fN1 and the variable capacitance CN1. For example, the processor does not store the frequency fN1 and the variable capacitance CN1 in the memory device of the host computer system 112. As another example, the processor erases the frequency fN1 and the variable capacitance CN1 from the memory device.

In some embodiments, instead of discarding the frequency fN1 and the variable capacitance CN1, a pre-determined weight is assigned by the processor to the frequency fN1 to generate a weighted frequency fwN1 and a pre-determined weight is assigned by the processor to the variable capacitance CN1 to generate a weighted capacitance CwN1, and a sum SfN of the weighted frequency fwN1 and another weighted frequency fwwN1 and a sum ScN of the weighted capacitance CwN1 and another weighted capacitance CwwN1 are used by the processor below. A lower amount of weight is assigned to the capacitance CN1 than to another capacitance CoN1 and a lower amount of weight is assigned to the frequency fN1 compared to another frequency foN1. The other weighted capacitance CwwN1 is generated by the processor by assigning a weight to the other capacitance CoN1 and the other weighted frequency fwwN1 is generated by the processor by assigning a weight to the other frequency foN1. The other frequency foN1 and the other weighted capacitance CoN1 are ones for which a measured impedance at the input 107 of the impedance matching network 1 is within the threshold of the pre-determined impedance.

Upon discarding the frequency fN1 and the variable capacitance CN1, an operation 158 of the method 150 is performed. For example, a frequency of the RF signal generated by the network analyzer 102 is modified, e.g., from fN1 to fN2, fN2 to fN3, etc., and/or a variable combined capacitance of the impedance matching network 1 is modified, e.g., from CN1 to CN2, from CN2 to CN3, etc., so that an input impedance ZiNQm, measured at the input 107 of the impedance matching network 1, is within the pre-determined threshold of the pre-determined impedance. For example, the network analyzer 1 changes a frequency of the RF signal from fN1 to fN2, and the variable capacitance CN1 is not changed. The input impedance ZiNQm measured by the network analyzer 102 is within the pre-determined threshold of the pre-determined impedance. The processor stores the frequency fN2 and the variable capacitance CN1 within the memory device. As another example, the variable capacitance CN1 of the impedance matching network 1 is changed from CN1 to CN2. For example, the drive assembly controls plates of a variable capacitor of the impedance matching network 1 to modify the variable capacitance of the variable capacitor so that the combined variable capacitance of all variable capacitors of the impedance matching network 1 is CN2. When the network analyzer 102 supplies the RF signal having the frequency fN1 to the impedance matching network 1, the network analyzer 102 measures the impedance ZiNQm at the input 107 of the impedance matching network 1 and the processor determines that the impedance ZiNQm is within the pre-determined threshold from the pre-determined impedance. The frequency fN1 and the variable capacitance CN2 are stored in the memory device. In this manner, multiple frequencies fNn and multiple capacitances CNn are calculated and stored in the memory device for which the impedance ZiNQm is within the pre-determined threshold.

In some embodiments, any number, e.g., 10, 15, 20, 100, 200, 300, 1000, 10000, 100000, 1000000, etc., of load impedance fixtures, e.g., N, etc., are used to determine frequencies of the network analyzer 102 and variable capacitances of the impedance matching network 1 for which an impedance at the input 107 of the branch circuit of the impedance matching network 1 is within the pre-determined threshold of the pre-determined impedance. Each of the load impedance fixtures N mimics a different plasma condition of plasma within the plasma chamber.

It should be noted that when the impedance matching network 1 is connected to the network analyzer 102, the impedance matching network 1 is not connected to a plasma chamber, which is further described below. Moreover, when the impedance matching network 1 is connected to the network analyzer 102, there is no processing of a wafer in the plasma processing chamber. This saves on-tool time of using the plasma processing chamber.

Figure 2A:
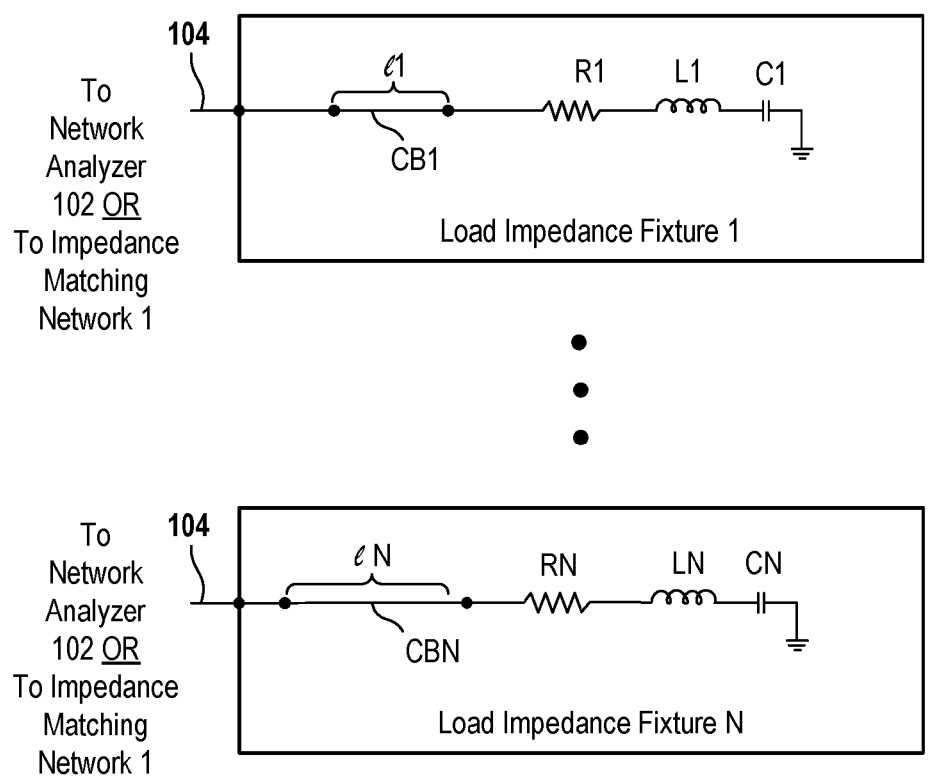
FIG. 2A is a diagram illustrating various embodiments of a load impedance fixture.

FIG. 2A is a diagram illustrating various embodiments of a load impedance fixture. The load impedance fixture 1 includes a cable CB1 of a length l1, a resistor R1, an inductor L1, and a capacitor C1. The resistor R1 has a resistance R1, the capacitor C1 has a capacitance C1, and the inductor L1 has an inductance L1. In some embodiments, the load impedance fixture 1 includes at least one of the cable CB1, the resistor R1, the inductor L1, and the capacitor C1. For example, the load impedance fixture 1 includes the cable CB1 and excludes the resistor R1, the inductor L1, the capacitor C1. As another example, the load impedance fixture 1 includes the inductor L1 and the capacitor C1, and excludes the cable CB1, and the resistor R1.

The load impedance fixture N includes a cable CBN of a length lN, a resistor RN, an inductor LN, and a capacitor CN. The resistor RN has a resistance RN, the capacitor CN has a capacitance CN, and the inductor LN has an inductance LN. In some embodiments, the load impedance fixture N includes at least one of the cable CBN, the resistor RN, the inductor LN, and the capacitor CN. For example, the load impedance fixture N includes the cable CBN and excludes the resistor RN, the inductor LN, the capacitor CN. As another example, the load impedance fixture N includes the inductor LN and the capacitor CN, and excludes the cable CBN and the resistor RN. As yet another example, the load impedance fixture N includes the inductor LN, and excludes the capacitor CN, the cable CBN, and the resistor RN.

It should be noted that the load impedance fixture N has at least one of the cable length lN, the resistance RN, the capacitance CN, and the inductance LN that is different from a corresponding one of the cable length C1, the resistance R1, the capacitance C1, and the inductance L1 of the load impedance fixture 1. For example, the resistance R1 is the same as that of the resistance RN, the capacitance C1 is the same as the capacitance CN, and the inductance L1 is the same as the inductance LN, and the cable length L1 is different from the cable length LN. As another example, the resistance R1 is the same as that of the resistance RN, the capacitance C1 is the same as the capacitance CN, the cable length L1 is different from the cable length LN, and the inductance L1 is different from the inductance LN. As yet another example, the load impedance fixture 1 excludes the resistor R1 and the load impedance fixture N includes the resistor RN. As yet another example, the load impedance fixture 1 excludes the cable CB1 and the load impedance fixture N includes the cable CBN. As another example, the resistance R1 is the same as that of the resistance RN, the capacitance C1 is different from the capacitance CN, the cable length L1 is the same as the cable length LN, and the inductance L1 is different from the inductance LN.

In some embodiments, a plasma condition is represented using gamma instead of impedance. Gamma is a ratio of reflected power to supplied power. The reflected power is power reflected towards an RF generator from the plasma chamber and the power supplied is power supplied from the RF generator to the impedance matching network 1 when the impedance matching network 1 is connected to the RF generator via an RF cable and is connected to the plasma chamber via an RF transmission line.

In some embodiments, values of resistors used within multiple load impedance fixtures ranges between 0.4 ohms and 2 ohms. In various embodiments, a coaxial cable used within a load impedance fixture is a 50 ohm cable.

Figure 2B:
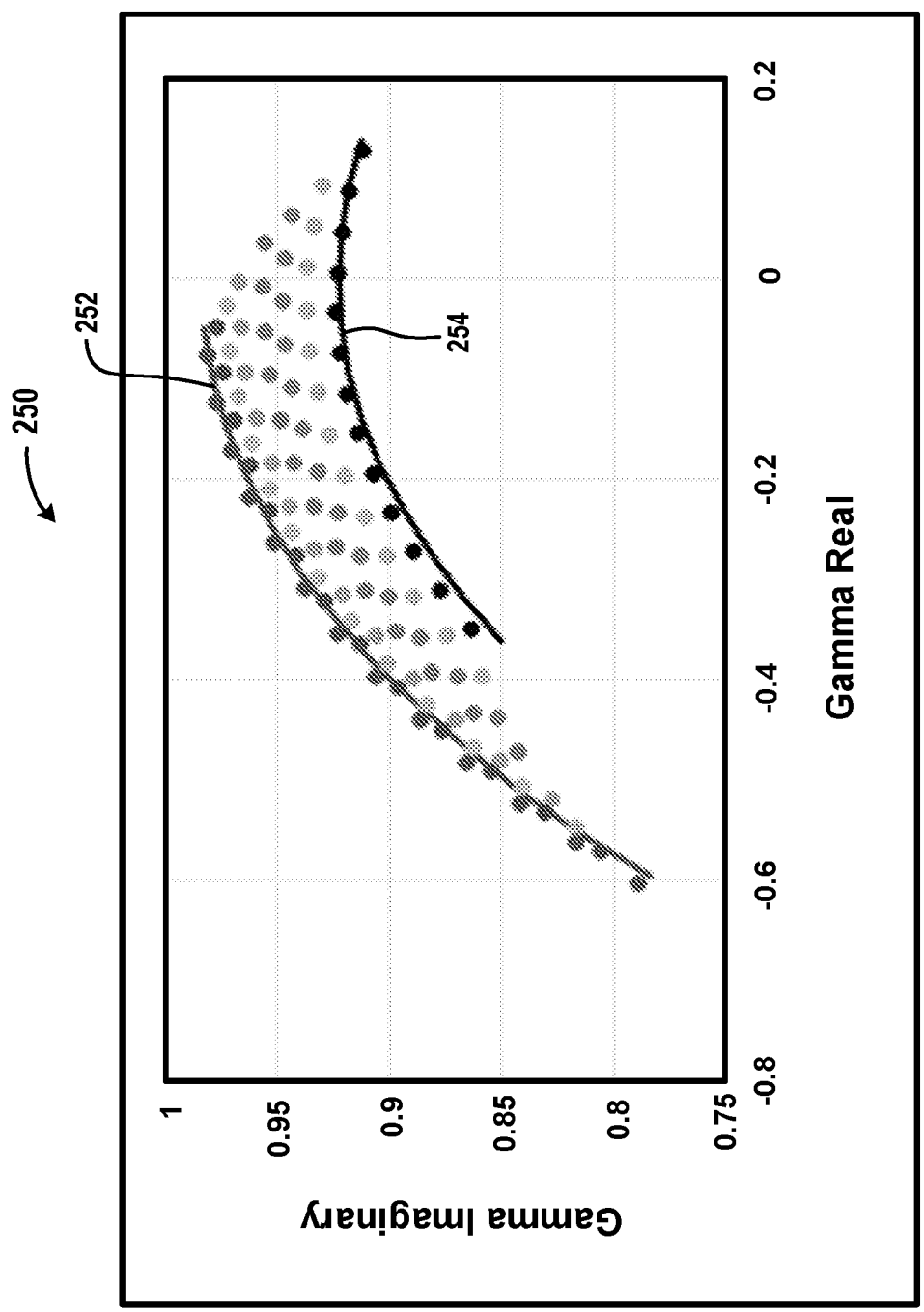
FIG. 2B is an embodiment of a graph to illustrate achievement of a variety of plasma conditions with use of the load impedance fixture 1 through load impedance fixture N.

FIG. 2B is an embodiment of a graph 250 to illustrate achievement of a variety of plasma conditions with use of the load impedance fixture 1 through load impedance fixture N. The graph 250 plots a real part of a reflection coefficient, which is represented by gamma, on an x-axis and an imaginary part of gamma on a y-axis. A top line 254 in the graph 250 is fitted to points that are measured by the network analyzer 102 for the variable capacitance C1 and different frequencies of the RF signal generated by the network analyzer 102 when coupled to the load impedance fixtures 1 through N having variable length coaxial cables and a resistor having a first value. Moreover, a bottom line 254 in the graph 250 is fitted to points that are measured by the network analyzer 102 for the variable capacitance CN and different frequencies of the RF signal generated by the network analyzer 102 when coupled to the load impedance fixtures 1 through N having variable length coaxial cables and a resistor having a second value. All points between the top line 252 and the bottom line 254 are measured by the network analyzer 102 for variable capacitances between the variable capacitance C1 and the variable capacitance CN and for different frequencies of the RF signal generated by the network analyzer 102 when coupled to the load impedance fixtures 1 through N.

Figure 3:
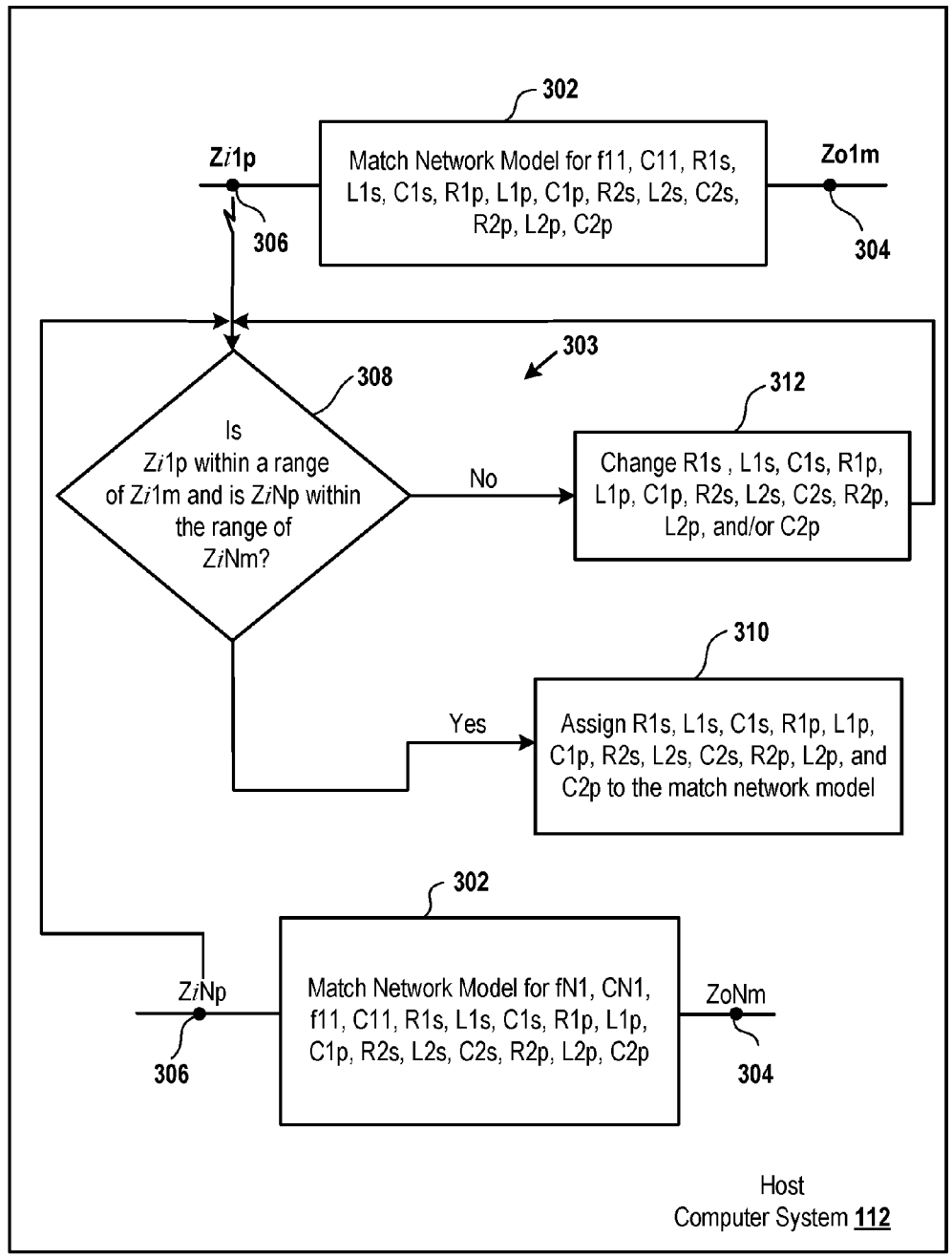
FIG. 3 is a diagram of an embodiment of a host computer system to illustrate determination of fixed parameters of the match network model.

FIG. 3 is a diagram of an embodiment of the host computer system 112 to illustrate determination of parameters of a match network model 302. An example of the match network model 302 is illustrated below with reference to FIG. 5. The match network model 302 includes a number of modules 1 through P, where P is an integer greater than zero. The module 1 includes a fixed series resistor R1$s$, fixed series inductor L1$s$, and a fixed series capacitor C1$s$. The module 1 further includes a fixed shunt resistor R1$p$, fixed shunt inductor L1$p$, and a fixed shunt capacitor C1$p$. Moreover, the module 2 includes a fixed series resistor R2$s$, fixed series inductor L2$s$, and a fixed series capacitor C2$s$. The module 2 further includes a fixed shunt resistor R2$p$, fixed shunt inductor L2$p$, and a fixed shunt capacitor C2$p$. Furthermore, the module 3 includes a fixed series resistor R3$s$, fixed series inductor L3$s$, and a fixed series capacitor C3$s$. The module 3 further includes a fixed shunt resistor R3$p$, fixed shunt inductor L3$p$, and a fixed shunt capacitor C3$p$. The match network model 302 is a computer-generated model of a portion of the impedance matching network 1. For example, the match network model 302 is a computer-generated model of the branch circuit of the impedance matching network 1 connected to the x MHz RF generator, or to the y MHz RF generator, or to the z MHz RF generator. The match network model 302 is generated by the processor of the host computer system 112.

The match network model 302 is derived from e.g., represents, etc., the branch circuit that is the portion of the impedance matching network 1. For example, when the x MHz RF generator is connected to the branch circuit that is a part of the impedance matching network 1, the match network model 302 represents, e.g., is a computer-generated model of, etc., the circuit of the impedance matching network 1. As another example, the match network model 302 does not have the same number of circuit components as that of the impedance matching network 1. The match network model 302 has a lower number of circuit elements than a number of circuit components of the branch circuit of the impedance matching network 1.

In some embodiments, the match network model 302 is a simplified form of a corresponding section of the impedance matching network 1. For example, variable capacitances of multiple variable capacitors of the branch circuit of the impedance matching network 1 are combined into a combined variable capacitance represented by one or more variable capacitive elements of the impedance matching model, and/or fixed inductances of multiple fixed inductors of the branch circuit of the impedance matching network 1 are combined into a combined fixed inductance represented by one or more fixed inductive elements of the impedance matching model, and/or fixed resistances of multiple fixed resistors of the branch circuit of the impedance matching network 1 are combined into a combined fixed resistance represented by one or more of fixed resistive elements of the match network model 302. To illustrate, capacitances of capacitors that are in series are combined by inverting each of the capacitances to generate multiple inverted capacitances, summing the inverted capacitances to generate an inverted combined capacitance, and by inverting the inverted combined capacitance to generate a combined capacitance. As another illustration, multiple inductances of inductors that are connected in series are summed to generate a combined inductance and multiple resistances of resistors that are in series are combined to generate a combined resistance. All fixed capacitances of all fixed capacitors of the portion of the impedance matching network 1 are combined into a combined fixed capacitance of one or more fixed capacitive elements of the match network model 302. Other examples of the match network model 302 are provided in the patent application having application Ser. No. 14/716,797 and in the patent application having application Ser. No. 14/245,803. Also, a manner of generating a match network model from an impedance matching network is described in the patent application having application Ser. No. 14/245,803.

It should be noted that a fixed parameter, e.g., resistance, capacitance, inductance, etc., is not variable. For example, the fixed parameter cannot be varied using the drive assembly while processing the wafer.

In various embodiments, the match network model 302 has the same topology, e.g., connections between circuit elements, number of circuit elements, etc., as that of the portion of the impedance matching network 1. For example, if the branch circuit of the impedance matching network 1 includes a capacitor coupled in series with an inductor, the match network model 302 includes a capacitor coupled in series with an inductor. In this example, the inductors of the branch circuit of the impedance matching network 1 and of the match network model 302 have the same value and the capacitors of the branch circuit of the impedance matching network 1 and of the match network model 302 have the same value. As another example, if the portion of the impedance matching network 1 includes a capacitor coupled in parallel with an inductor, the match network model 302 includes a capacitor coupled in parallel with an inductor. In this example, the inductors of the branch circuit of the impedance matching network 1 and of the match network model 302 have the same value and the capacitors of the branch circuit of the impedance matching network 1 and of the match network model 302 have the same value. As another example, the match network model 302 has the same number and same types of circuit elements as that of circuit components of the impedance matching network 1 and has the same type of connections between the circuit elements as that between the circuit components. Examples of types of circuit elements include resistors, inductors, and capacitors, and examples of type of connections include serial, parallel, etc.

A method 303 is executed by the processor of the host computer system 112. The processor receives from the network analyzer 112 the measured load impedance Zo1$m$ and the measured load impedance ZoN$m$. The processor initiates the match network model 302 to have the parameters including the frequency f11, the combined variable capacitance C11, the fixed inductances L1$s$, L1$p$, L2$s$, L2$p$, the fixed resistances R1$s$, R1$p$, R2$s$, R2$p$, and the fixed capacitances C1$s$, C1$p$, C2$s$, C2$p$. For the purpose of describing FIG. 3, the match network model 302 that has the modules 1 and 2 without having any of the remaining modules 3 through P is used. In some embodiments, instead of the combined variable capacitance, the match network model 302 is initialized to have the sum Sc1 and instead of the frequency f11, the match network model 302 is initialized to have the sum Sf1.

As an example, the parameters C11 and f11 applied to the match network model 302 mimic the impedance matching network 1 when the impedance matching network 1 is supplied the RF signal having the frequency f11 by the network analyzer 102 after being connected to the load impedance fixture 1, has one or more motor-driven capacitors having the combined variable capacitance of C11, has one or more fixed capacitors having a combined fixed capacitance of C1$s$, has one or more capacitors having a combined fixed capacitance of C2$s$, has one or more capacitors having a combined fixed capacitance of C1$p$, has one or more fixed capacitors having a combined fixed capacitance of C2$p$, has one or more fixed resistors having a combined fixed resistance of R1$s$, has one or more fixed resistors having a combined fixed resistance of R2$s$, has one or more fixed resistors having a combined fixed resistance of R1$p$, has one or more fixed resistors having a combined fixed resistance of R2$p$, has one or more fixed inductors having a combined fixed inductance of L1$s$, has one or more fixed inductors having a combined fixed inductance of L2$s$, has one or more fixed inductors having a combined fixed inductance of L1$p$, and has one or more fixed inductors having a combined fixed inductance of L2$p$.

In some embodiments, fixed parameter values of many elements of the match network model 302 are zero or the match network model 302 is not sensitive to fixed parameter values of the elements. For example, a large change in a value of a fixed element to which the match network model 302 is insensitive does not produce a large change in impedance of the match network model 302.

In some embodiments, a fixed element, e.g., an inductor, a resistor, a capacitor, etc., has a fixed parameter value that is not changed, e.g., using a motor, etc.

The processor calculates a predicted input impedance Zi1$p$, which is impedance at an input of the match network model 302 from the measured load impedance Zo1$m$ and the parameters f11, C11, L1$s$, L1$p$, L2$s$, L2$p$, R1$s$, R1$p$, R2$s$, R2$p$, C1$s$, C1$p$, C2$s$, and C2$p$, by back propagating the measured load impedance Zo1$m$ via the match network model 302. For example, the processor calculates an impedance ZC11 of the one or more capacitive elements having the variable capacitance C11 from the frequency f11 and from the capacitance C11, calculates an impedance ZL11$s$ of the inductor L1$s$ from the frequency f11 and from the inductance L1$s$, calculates an impedance ZL21$s$ of the inductor L2$s$ from the frequency f11 and from the inductance L2$s$, calculates an impedance ZL11$p$ of the inductor L1$p$ from the frequency f11 and from the inductance L1$p$, calculates an impedance ZL21$p$ of the inductor L2$p$ from the frequency f11 and from the inductance L2$p$, calculates an impedance ZC11$s$ of the capacitor C1$s$ from the frequency f11 and from the capacitance C1$s$, calculates an impedance ZC21$s$ of the capacitor C2$s$ from the frequency f11 and from the capacitance C2$s$, calculates an impedance ZC11$p$ of the capacitor C1$p$ from the frequency f11 and from the capacitance C1$p$, calculates an impedance $ZC21p$ of the capacitor $C2p$ from the frequency f11 and from the capacitance $C2p$, calculates an impedance $ZR1s$ as being the resistance $R1s$ of the resistor $R1s$, calculates an impedance $ZR2s$ as being the resistance $R2s$ of the resistor $R2s$, calculates an impedance $ZR1p$ as being the resistance $R1p$ of the resistor $R1p$, calculates an impedance $ZR2p$ as being the resistance $R2p$ of the resistor $R2p$. To illustrate, the processor calculates an impedance of a capacitor as being $(1/j\omega C)$, and calculates an impedance of an inductor as being $j\omega L$, where $\omega$ is equal to $2\pi f11$. The processor calculates the predicted input impedance $Zi1p$ by combining, e.g. summing, subtracting, generating a directional sum of, etc., the impedances $ZC11$, $ZC11s$, $ZC21s$, $ZC11p$, $ZC21p$, $ZL11s$, $ZL21s$ $ZL11p$, $ZL21p$, $ZR1s$, $ZR2s$, $ZR1p$, and $ZR2p$ with the measured load impedance $Zo1m$. For example, when the match network model 302 includes the module 1 without the modules 2 thru P, a directional sum of the impedances $ZC11p$, $ZL11p$, and $ZR1p$ is a sum of the impedances $ZC11p$, $ZL11p$, and $ZR1p$. In this example, the sum of the impedances is added to a sum of the impedances $ZR1s$, $ZL11s$, and $ZC11s$ to generate a directional sum of the impedances $ZC11p$, $ZL11p$, $ZR1p$, $ZR1s$, $ZL11s$, and $ZC11s$.

Similarly, the processor calculates a predicted input impedance $ZiNp$ at the input 306 of the match network model 302 from the measured load impedance $ZoNm$ applied at the output 304 and the parameters of the match network model 302 by back propagating the measured load impedance $ZoNm$ via the match network model 302. For example, the processor changes the parameters of the match network model 302 from f11 to fN1, from C11 to CN1, but leaves the fixed parameters, e.g., $L1s$, $L1p$, $L2s$, $L2p$, $R1s$, $R1p$, $R2s$, $R2p$, $C1s$, $C1p$, $C2s$, and $C2p$, unchanged. In embodiments in which weighted capacitances and weighted frequencies are used, the processor changes the parameters of the match network model 302 from Sf1 to SfN and from Sc1 to ScN.

The parameters CN1 and fN1 applied to the match network model 302 mimic the impedance matching network 1 when the impedance matching network 1 is supplied the RF signal having the frequency fN1 by the network analyzer 102 after being connected to the load impedance fixture N, has one or more motor-driven capacitors having the combined variable capacitance of CN1, has one or more fixed capacitors having the combined fixed capacitance of $C1s$, has one or more fixed capacitors having the combined fixed capacitance of $C2s$, has one or more fixed capacitors having the combined fixed capacitance of $C1p$, has one or more fixed capacitors having the combined fixed capacitance of $C2p$, has one or more fixed resistors having the combined fixed resistance of $R1s$, has one or more fixed resistors having the combined fixed resistance of $R2s$, has one or more fixed resistors having the combined fixed resistance of $R1p$, has one or more fixed resistors having the combined fixed resistance of $R2p$, has one or more fixed inductors having the combined fixed inductance of $L1s$, has one or more fixed inductors having the combined fixed inductance of $L2s$, has one or more fixed inductors having the combined fixed inductance of $L1p$, and has one or more fixed inductors having the combined fixed inductance of $L2p$. The processor calculates an impedance $ZCN1$ of the one or more capacitive elements having the variable capacitance CN1 from the frequency fN1 and from the capacitance CN1, calculates an impedance $ZL1Ns$ of the inductor $L1s$ from the frequency fN1 and from the inductance $L1s$, calculates an impedance $ZL2Ns$ of the inductor $L2s$ from the frequency fN1 and from the inductance $L2s$, calculates an impedance $ZL1Np$ of the inductor $L1p$ from the frequency fN1 and from the inductance $L1p$, calculates an impedance $ZL2Np$ of the inductor $L2p$ from the frequency fN1 and from the inductance $L2p$, calculates an impedance $ZC1Ns$ of the capacitor $C1s$ from the frequency fN1 and from the capacitance $C1s$, calculates an impedance $ZC2Ns$ of the capacitor $C2s$ from the frequency fN1 and from the capacitance $C2s$, calculates an impedance $ZC1Np$ of the capacitor $C1p$ from the frequency fN1 and from the capacitance $C1p$, calculates an impedance $ZC2Np$ of the capacitor $C2p$ from the frequency fN1 and from the capacitance $C2p$, and calculates the impedances $ZR1s$, $ZR2s$, $ZR1p$, and the impedance $ZR2p$. To illustrate, the processor calculates an impedance of a capacitor as being $(1/j\omega C)$, and calculates an impedance of an inductor as being $j\omega L$, where $\omega$ is equal to $2\pi fN1$. The processor calculates the predicted input impedance $ZiNp$ by combining, e.g. summing, subtracting, etc., the impedances $ZCN1$, $ZC1Ns$, $ZC2Ns$, $ZC1Np$, $ZC2Np$, $ZL1Ns$, $ZL2Ns$ $ZL1Np$, $ZL2Np$, $ZR1s$, $ZR2s$, $ZR1p$, and $ZR2p$ from the output measured load $ZoNm$ to determine the predicted input impedance $ZiNp$ in a manner similar to that described above for calculating the predicted input impedance $Zi1p$ by combining the impedances $ZC11$, $ZC11s$, $ZC21s$, $ZC11p$, $ZC21p$, $ZL11s$, $ZL21s$ $ZL11p$, $ZL21p$, $ZR1s$, $ZR2s$, $ZR1p$, and $ZR2p$ with the output measured load $Zo1m$.

In an operation 308 of the method 303, the processor of the host computer system 112 determines whether the predicted input impedance $Zi1p$ is within a pre-determined range from the measured input impedance $Zi1m$ and whether the predicted input impedance $ZiNp$ is within the pre-determined range from the measured input impedance $ZiNm$. For example, the determinations of whether the predicted input impedance $Zi1p$ is within the pre-determined range from the measured input impedance $Zi1m$ and whether the predicted input impedance $ZiNp$ is within the pre-determined range from the measured input impedance $ZiNm$ are executed simultaneously, e.g., at the same time, during the same clock cycle, etc., by the processor. It should be noted that the operation 308 is performed for all the load impedance fixtures. For example, if three load impedance fixtures 1, 2, and 3 are used in a manner described above in which the fixtures load impedance fixtures 1 and 2 are used, the processor determines whether the predicted input impedance $Zi1p$ is within a pre-determined range from the measured input impedance $Zi1m$, whether a predicted input impedance $Zi2p$ is within a pre-determined range from a measured input impedance $Zi2m$, and whether the predicted input impedance $ZiNp$ is within the pre-determined range from the measured input impedance $ZiNm$. The measured input impedance $Zi2m$ is measured by the network analyzer 102 when a load impedance fixture 2 is connected to the impedance matching network 1 via the RF cable 108 (FIG. 1B) and the impedance matching network 1 is further connected to the network analyzer 102 via the RF cable 106 (FIG. 1B). Moreover, the predicted input impedance $Zi2p$ is calculated by the processor in a similar manner in which the predicted input impedances $Zi1p$ and $ZiNp$ are calculated by the processor.

Upon determining that the predicted input impedance $Zi1p$ is within the pre-determined range from the measured input impedance $Zi1m$ and that the predicted input impedance $ZiNp$ is within the pre-determined range from the measured input impedance $ZiNm$, in an operation 310 of the method 300, the processor assigns the parameters $L1s$, $L1p$, $L2s$, $L2p$, $R1s$, $R1p$, $R2s$, $R2p$, $C1s$, $C1p$, $C2s$, and $C2p$ to the match network model 302. For example, the processor maps the parameters $L1s$, $L1p$, $L2s$, $L2p$, $R1s$, $R1p$, $R2s$, R2$p$, C1$s$, C1$p$, C2$s$, and C2$p$ to an identification number, e.g., ID1, etc., of the match network model 302, and stores the mapping to in the memory device of the host computer system 112. On the other hand, upon determining that the predicted input impedance Zi1$p$ is not within the pre-determined range from the measured input impedance Zi1$m$ or that the predicted input impedance ZiNp is not within the pre-determined range from the measured input impedance ZiNm, the processor, in an operation 312 of the method 303, changes one or more of the fixed parameters L1$s$, L1$p$, L2$s$, L2$p$, R1$s$, R1$p$, R2$s$, R2$p$, C1$s$, C1$p$, C2$s$, and C2$p$ to generate one or more changed parameters.

In various embodiments, the processor is provided a pre-determined range of values of one or more of the parameters L1$s$, L1$p$, L2$s$, L2$p$, R1$s$, R1$p$, R2$s$, R2$p$, C1$s$, C1$p$, C2$s$, and C2$p$ by the user via the input device that is connected to the processor and the one or more of the parameters are changed to be within the pre-determined range. For example, the user indicates to the processor that the parameter L1$s$ is to be changed by 5% from a value, which is also provided to the processor by the user via the input device. During the operation 312, the processor changes the value of the parameter L1$s$ by 5%. As another example, the user indicates to the processor that the parameter C1$s$ is to be changed by 2% from a value, which is also provided to the processor by the user via the input device. During the operation 312, the processor changes the value of the parameter C1$s$ by 2%. As another example, the user indicates to the processor that the parameter C1$s$ is to be changed by 0% from a value, which is also provided to the processor by the user via the input device. During the operation 312, the processor changes the value of the parameter C1$s$ by 0%.

In some embodiments, instead of or in addition to changing one or more of the fixed parameters, L1$s$, L1$p$, L2$s$, L2$p$, R1$s$, R1$p$, R2$s$, R2$p$, C1$s$, C1$p$, C2$s$, and C2$p$, the processor, in the operation 312, changes the capacitance C11. For example, the capacitance C11 is a variable capacitance of one of the modules of the match network model 302 and the variable capacitance represents a motor-driven capacitor of the impedance matching network 1. In this example, the capacitance C11 is represented by an equation that is a sum of a constant term, a linear term, and a quadratic term. The linear term is a product of a first coefficient and a variable, e.g., a position in motor shaft revolution, etc. The quadratic term is a product of a second coefficient and a square of the variable. The processor, in the operation 312, changes a value of the constant, and/or the first coefficient, and/or the second coefficient to change the variable capacitance C11.

The processor repeats the operation 308 using the one or more changed parameters to determine whether the predicted input impedance Zi1$p$ for the changed parameters is within the pre-determined range from the measured input impedance Zi1$m$ and whether the predicted input impedance ZiNp for the changed parameters is within the pre-determined range from the measured input impedance ZiNm. In this manner, the processor repeats the operation 308 until the predicted input impedance Zi1$p$ is within the pre-determined range from the measured input impedance Zi1$m$ and the predicted input impedance ZiNp is within the pre-determined range from the measured input impedance ZiNm to find values of the fixed parameters for the match network model 302.

In the embodiments in which the measured input impedance Zi1$m$ is not within the pre-determined threshold of the pre-determined impedance as determined by the operation 132 of FIG. 1A and the measured input impedance ZiNm is not within the pre-determined threshold of the pre-determined impedance as determined by the operation 152 of FIG. 1B, the operation 308 is performed for the measured input impedances Zi1Qm and ZiNQm (see FIGS. 1A and 1B). For example, it is determined in the operation 308 whether the predicted input impedance Zi1$p$ obtained for the measured input impedance Zi1Qm is within the pre-determined range of the measured input impedance Zi1Qm and whether the predicted input impedance ZiNp obtained for the measured input impedance ZiNQm is within the pre-determined range of the measured input impedance ZiNQm. Upon determining that the predicted input impedance Zi1$p$ is within the pre-determined range of the measured input impedance Zi1Qm and that the predicted input impedance ZiNp is within the pre-determined range of the measured input impedance ZiNQm, the operation 310 is performed. On the other hand, upon determining that the predicted input impedance Zi1$p$ is not within the pre-determined range of the measured input impedance Zi1Qm and that the predicted input impedance ZiNp is not within the pre-determined range of the measured input impedance ZiNQm, the operation 312 is performed.

Figure 4:
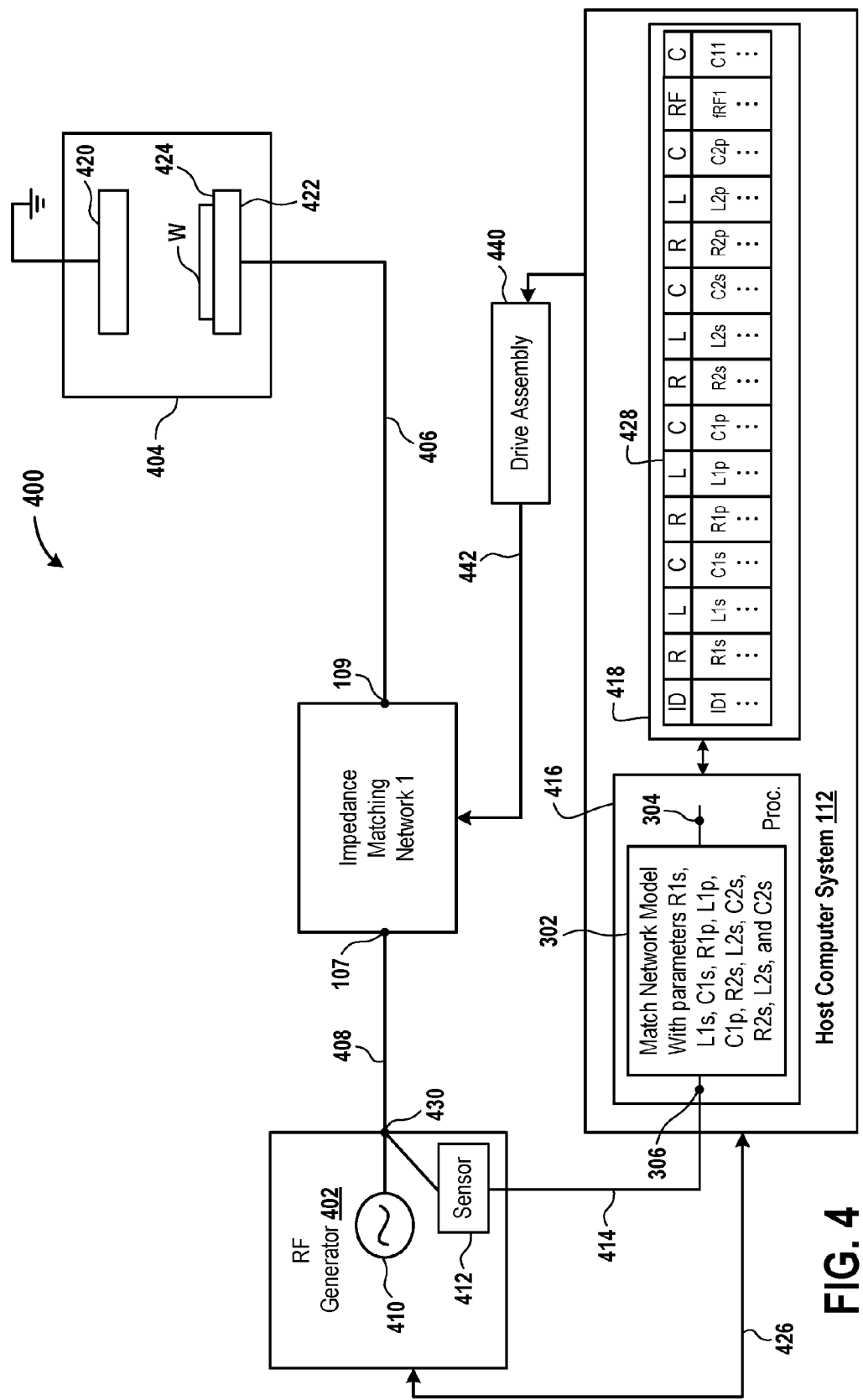
FIG. 4 is a diagram of an embodiment of a plasma system to illustrate use of the match network model with the fixed parameters within a plasma system.

FIG. 4 is a diagram of an embodiment of a plasma system 400 to illustrate use of the match network model 302 within the plasma system 400. The plasma system 400 includes an RF generator 402, the impedance matching network 1, a plasma chamber 404, and the host computer system 112. The RF generator 402 is the x MHz RF generator, or the y MHz RF generator, or the z MHz RF generator. The RF generator 402 is operated at a frequency fRF1. The plasma chamber 404 is connected to the impedance matching network 1 via an RF transmission line 406 and the impedance matching network 1 is connected to the RF generator 402 via an RF cable 408.

The RF generator 402 includes an RF power supply 410 and a sensor 412, e.g., a complex voltage and current sensor, a complex impedance sensor, a complex voltage sensor, a complex current sensor, etc. The sensor 412 is connected to the host computer system 112 via a network cable 414, e.g., a serial transfer cable, a parallel transfer cable, a USB cable, etc. The host computer system 112 includes a processor 416 and a memory device 418.

The plasma chamber 404 includes an upper electrode 420, a chuck 422, and a wafer W. The upper electrode 420 faces the chuck 422 and is grounded, e.g., coupled to a reference voltage, coupled to zero voltage, coupled to a negative voltage, etc. Examples of the chuck 422 include an electrostatic chuck (ESC) and a magnetic chuck. A lower electrode of the chuck 422 is made of a metal, e.g., anodized aluminum, alloy of aluminum, etc. Also, the upper electrode 420 is made of a metal, e.g., aluminum, alloy of aluminum, etc. The upper electrode 420 is located opposite to and facing the lower electrode of the chuck 422.

In some embodiments, the plasma chamber 404 is formed using additional parts, e.g., upper electrode extension that surrounds the upper electrode 420, a lower electrode extension that surrounds the lower electrode of the chuck 422, a dielectric ring between the upper electrode 420 and the upper electrode extension, a dielectric ring between the lower electrode and the lower electrode extension, confinement rings located at edges of the upper electrode 420 and the chuck 422 to surround a region within the plasma chamber 404 in which plasma is formed, etc.

The wafer W is placed on a top surface 424 of the chuck 422 for processing, e.g., depositing materials on the wafer W, or cleaning the wafer W, or etching layers deposited on the wafer W, or doping the wafer W, or implantation of ions on the wafer W, or creating a photolithographic pattern on the wafer W, or etching the wafer W, or sputtering the wafer W, or a combination thereof.

The processor 416 of the host computer system 112 accesses a recipe, e.g., the frequency fRF1 of an RF signal to be generated by the RF generator 402, an amount of power of the RF signal to be generated by the RF generator 402, etc., from the memory device 418 of the host computer system 112, and provides the recipe via a network cable 426 to the RF generator 402.

The recipe also includes a combined variable capacitance of the impedance matching network 1 to be achieved. The processor is connected to a drive assembly 440, which is connected via a connection mechanism 442 to the one or more variable capacitors of the impedance matching network 1. Examples of the drive assembly 440 include one or more drivers, e.g., one or more transistors, etc., which are connected to respective one or more motors. The one or more motors are connected to respective one or more rods of the connection mechanism 442. The processor 416 controls the drive assembly 440 to control the one or more variable capacitors of the impedance matching network 1 via the connection mechanism 442 to achieve the corresponding one or more capacitance values to further achieve the combined variable capacitance. For example, the processor 416 sends a signal to one of the one or more drivers that is connected to one of the one or more motors. Upon receiving the signal, the driver generates a current signal that is provided to a stator the motor. A rotor in communication with the stator rotates to rotate one or more rods of the connection mechanism 442 connected to the rotor. The rotation of the one or more rods changes a position of a plate of one of the one or more variable capacitors of the impedance matching network 1 to change a combined variable capacitance of the impedance matching network 1. Similarly, other ones of the one or more variable capacitors of the impedance matching network 1 are controlled by the processor 416 to achieve the combined variable capacitance. The combined capacitance of all the variable capacitors of the impedance matching network 1 to be achieved is represented as the combined variable capacitance C11.

The RF generator 402 receives the recipe and generates the RF signal having the frequency fRF1 and power within the recipe. The branch circuit of the impedance matching network 1 having the combined variable capacitance C11 receives the RF signal having the frequency fRF1 from the RF generator 402 via the input 107 of the impedance matching network 1 and matches an impedance of a load connected to the output 109 of the impedance matching network 1 with that of a source connected to the input 107 of the impedance matching network 1 to generate a modified RF signal. Examples of the source include the RF generator 402 and the RF cable 408 that couples the RF generator 402 to the impedance matching network 1. Examples of the load include the RF transmission line 406 and the plasma chamber 404. The RF transmission line 406 connects the lower electrode of the chuck 422 to the impedance matching network 1. The modified RF signal is provided by the impedance matching network 1 via the RF transmission line 406 to the chuck 422.

The chuck 422 receives the modified RF signal and upon entry of a process gas within the plasma chamber 404, plasma is stricken or maintained within the plasma chamber 404. Examples of the process gas include an oxygen-containing gas or a fluorine-containing gas, etc. and the process gas is provided within the gap between the upper electrode 420 and the chuck 422. The plasma is used to process the wafer W.

The match network model 302 is stored in the memory device 418 of the host computer system 112. Moreover, the memory device 418 stores a database 428 that includes an association between an identification of an impedance matching network 1, values of the parameters of the match network model 302, the frequency fRF1 of the RF signal generated by the RF generator 402, and the combined variable capacitance C11 of the impedance matching network 1. For example, the database 428 stores the identification number, e.g., ID1, etc., of the impedance matching network 1, and a mapping between the ID1 and the fixed parameters L1$s$, L1$p$, L2$s$, L2$p$, R1$s$, R1$p$, R2$s$, R2$p$, C1$s$, C1$p$, C2$s$, and C2$p$, that are determined using the method 303 (FIG. 3). Examples of an identification of an impedance matching network include a serial number of the impedance matching network. Moreover, in this example, the memory device 418 stores an ID2 of another impedance matching network 2, and a mapping between the ID2 and the parameters of the impedance matching network 2. The parameters of the impedance matching network 2 are determined in a similar manner as that of determining the parameters of the impedance matching network 1 illustrated above using FIGS. 1A, 1B, and 3. The impedance matching network 1 is assigned a serial number different from a serial number assigned to the impedance matching network 2 and both the impedance matching networks 1 and 2 have the same model number. In some embodiments, a serial number is on a housing of an impedance matching network and so is a model number. In various embodiments, an identification number includes letters, numbers, symbols, or a combination of two or more of letters, numbers, and symbols.

The processor 416 of the host computer system 112 receives an indication from a user via the input device, e.g., a stylus, a touchpad, a touchscreen, a button, a mouse, etc., that is connected to the host computer system 112 that the RF generator 402 is connected to the impedance matching network 1 having the ID1. The processor 416 identifies from the memory device 418 that the ID1 of the impedance matching network 1 is associated with the parameters L1$s$, L1$p$, L2$s$, L2$p$, R1$s$, R1$p$, R2$s$, R2$p$, C1$s$, C1$p$, C2$s$, and C2$p$ of the match network model 302. The processor 416 accesses, e.g., reads, etc., the parameters L1$s$, L1$p$, L2$s$, L2$p$, R1$s$, R1$p$, R2$s$, R2$p$, C1$s$, C1$p$, C2$s$, and C2$p$ from the memory device 418 and controls the match network model 302 to adjust the parameters of the match network model 302 to have values L1$s$, L1$p$, L2$s$, L2$p$, R1$s$, R1$p$, R2$s$, R2$p$, C1$s$, C1$p$, C2$s$, and C2$p$ associated with the impedance matching network 1.

When a measured variable, e.g., a complex voltage, a complex current, a complex impedance, a complex power, a complex voltage and current, etc., is received by the processor 416 via the network cable 414 from the sensor 412 that is connected to an output 430 of the RF generator 402, the processor 416 applies the measured variable to the input 306 of the match network model 302 to generate a predicted variable at the output 304 of the match network model 302. The measured variable is forward propagated by the processor 416 via the match network model 302 from the input 306 to the output 304 to generate an output variable at the output 304 of the match network model 302. For example, the processor 416 calculates a directional sum of a complex voltage received at the input of the match network model 302, a complex voltage across a resistive element having the resistance R1$s$ within the match network model 302, a complex voltage across an inductive element having the inductance L1$s$ within the match network model 302, a complex voltage across a capacitive element having the fixed capacitance C1$s$, a complex voltage across a resistive element having the resistance R2$s$ within the match network model 302, a complex voltage across an inductive element having the inductance L2$s$ within the match network model 302, a complex voltage across a capacitive element having the fixed capacitance C2$s$, and a complex voltage across a capacitive element having the variable capacitance C11 within the match network model 302. It should be noted that the complex voltages received at the input of the match network model 302, across the resistive element having the resistance R1$s$ within the match network model 302, across the inductive element having the inductance L1$s$ within the match network model 302, across the capacitive element having the fixed capacitance C1$s$, across the resistive element having the resistance R2$s$ within the match network model 302, across the inductive element having the inductance L2$s$ within the match network model 302, across the capacitive element having the fixed capacitance C2$s$, and across the capacitive element having the variable capacitance C11 within the match network model 302 have a frequency of fRF1 to generate a complex value at the output 304 of the match network model 302. The complex voltage received at the input 306 of the match network model 302 is measured by the sensor 412 connected to the output 430 of the RF generator 402 and is received from the sensor 412. As such, there is no need to use a sensor, e.g., a voltage sensor, a current sensor, a complex impedance sensor, a complex voltage and current sensor, etc., between the impedance matching network 1 and the plasma chamber 404 to determine a value of the variable at the output 109 of the impedance matching network 1. Such sensors are expensive to use. Comparatively, the sensor 412 is already a part of the RF generator 402, and is ready to use.

In some embodiments, the fixed values L1$s$, L1$p$, L2$s$, L2$p$, R1$s$, R1$p$, R2$s$, R2$p$, C1$s$, C1$p$, C2$s$, and C2$p$ apply to all impedance matching networks of the same model. For example, the fixed values L1$s$, L1$p$, L2$s$, L2$p$, R1$s$, R1$p$, R2$s$, R2$p$, C1$s$, C1$p$, C2$s$, and C2$p$ are applied by the processor 416 to calculate the variable at the output 304 of the match network model 302 based on a value of the parameter obtained from the sensor 412 when impedance matching networks having different serial numbers but having the same model number are consecutively connected to the output 430 of the RF generator 402.

Figure 5:
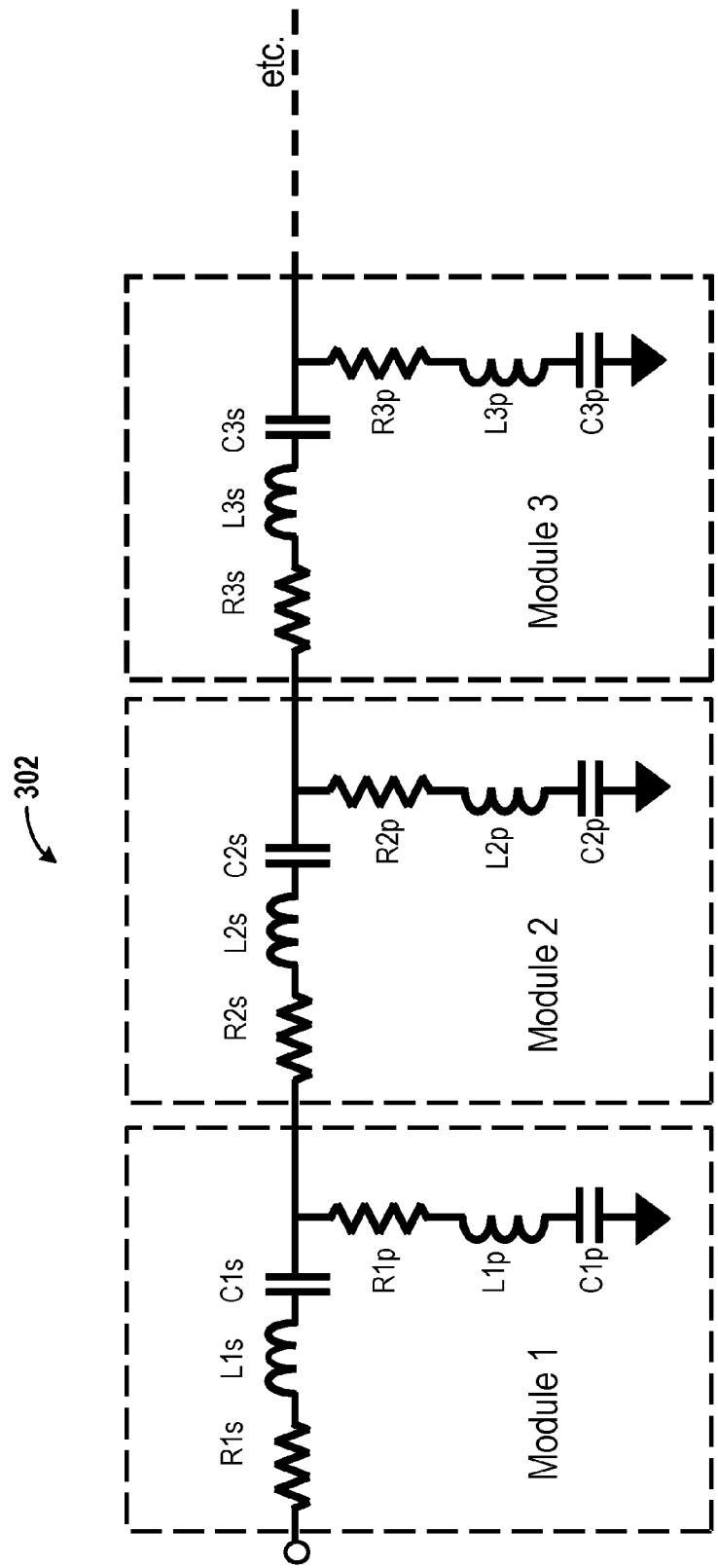
FIG. 5 is a block diagram of an embodiment of a match network model to illustrate a modular form of the match network model.

FIG. 5 is a block diagram of an embodiment of the match network module 302. A series circuit that includes the resistor R1$s$, the inductor L1$s$, and the capacitors C1$s$ is connected to a shunt circuit that includes the resistor R1$p$, the inductor L1$p$, and the capacitors C1$p$. Moreover, a series circuit that includes the resistor R2$s$, the inductor L2$s$, and the capacitors C2$s$ is connected to a shunt circuit that includes the resistor R2$p$, the inductor L2$p$, and the capacitors C2$p$. Also, a series circuit that includes the resistor R3$s$, the inductor L3$s$, and the capacitors C3$s$ is connected to a shunt circuit that includes the resistor R3$p$, the inductor L3$p$, and the capacitors C3$p$.

It should be noted that in some of the above-described embodiments, an RF signal is supplied to the lower electrode of the chuck 422 and the upper electrode 420 is grounded. In various embodiments, an RF signal is 412 to the upper electrode 420 and the lower electrode of the chuck 422 is grounded.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSP)s, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physic al quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for using multiple fixtures for applying a variety of plasma conditions to determine fixed parameters of a match network model, comprising:

receiving a first output impedance measured at an input of a first fixture;

receiving a first input impedance measured at an input of an impedance matching network, wherein the first input impedance is measured when an output of the impedance matching network is connected to the input of the first fixture;

receiving a second output impedance measured at an input of a second fixture;

receiving a second input impedance measured at the input of the impedance matching network, wherein the second input impedance is measured when the output of the impedance matching network is connected to the input of the second fixture;

applying the first measured output impedance at an output of a match network model to calculate a first predicted input impedance at an input of the match network model when the match network model is assigned a first frequency, a first variable capacitance, a first fixed inductance, a first fixed capacitance, and a first fixed resistance;

applying the second measured output impedance at the output of the match network model to calculate a second predicted input impedance at the input of the match network model when the match network model is assigned a second frequency, a second variable capacitance, the first fixed inductance, the first fixed capacitance, and the first fixed resistance;

determining whether the first predicted input impedance is within a predetermined range from the first measured input impedance and whether the second predicted input impedance is within the predetermined range from the second measured input impedance; and assigning the first fixed inductance, the first fixed capacitance, and the first fixed resistance to the match network model upon determining that the first predicted input impedance is within the predetermined range from the first measured input impedance and that the second predicted input impedance is within the predetermined range from the second measured input impedance.

2. The method of claim 1,
wherein the first measured input impedance is measured for the first variable capacitance of the impedance matching network when the input of the impedance matching network is connected to an output of a network analyzer operating at the first frequency, wherein the second measured input impedance is measured for the second variable capacitance of the impedance matching network when the input of the impedance matching network is connected to the output of the network analyzer operating at the second frequency, the method further comprising:
determining whether the first measured input impedance is within a predetermined threshold of a predetermined impedance;

storing the first frequency and the first variable capacitance upon determining that the first measured input impedance is within the predetermined threshold of the predetermined impedance;

determining whether the second measured input impedance is within the predetermined threshold of the predetermined impedance; and storing the second frequency and the second variable capacitance upon determining that the second measured input impedance is within the predetermined threshold of the predetermined impedance.

3. The method of claim 1, wherein the first measured input impedance is measured by a network analyzer, wherein the first measured input impedance is a complex value, wherein the input of the impedance matching network is configured to be coupled to a branch circuit of the impedance matching network, wherein the branch circuit is configured to be coupled to an RF generator during processing of a wafer.

4. The method of claim 1, wherein the first measured input impedance is measured for the first variable capacitance of the impedance matching network when the input of the impedance matching network is connected to an output of a network analyzer operating at the first frequency, wherein the first variable capacitance of the impedance matching network is a combined variable capacitance of one or more variable capacitors of the impedance matching network.

5. The method of claim 1, wherein the first fixture is a load impedance fixture for obtaining an S11 measurement and the second fixture is a load impedance fixture for obtaining an S11 measurement.

6. The method of claim 1, wherein the second input impedance is measured by a network analyzer, wherein the second input impedance is a complex value, wherein the input of the impedance matching network is configured to be coupled to a branch circuit of the impedance matching network, wherein the branch circuit is configured to be coupled to an RF generator during processing of a wafer.

7. The method of claim 1, wherein the second measured input impedance is measured for the second variable capacitance of the impedance matching network when the input of the impedance matching network is connected to an output of a network analyzer operating at the second frequency, wherein the second variable capacitance of the impedance matching network is a combined variable capacitance of one or more variable capacitors of the impedance matching network.

8. The method of claim 1, wherein determining whether the first predicted input impedance is within the predetermined range from the first measured input impedance is performed simultaneously with determining whether the second predicted input impedance is within the predetermined range from the second measured input impedance.

9. The method of claim 1, further comprising calculating an output value of a variable at the output of the match network model during a time the match network model is assigned the first fixed inductance, the first fixed capacitance, and the first fixed resistance, wherein calculating the output value of the variable is performed by forward propagating an input value of the variable measured by a sensor connected to an output of an RF generator.

10. A system for using multiple fixtures for applying a variety of plasma conditions to determine fixed parameters of a match network model, comprising:
a processor configured to receive a first output impedance measured at an input of a first fixture, wherein the processor is configured to receive a first input impedance measured at an input of an impedance matching network, wherein the first measured input impedance is measured when an output of the impedance matching network is connected to the input of the first fixture, wherein the processor is configured to receive a second output impedance measured at an input of a second fixture, wherein the processor is configured to receive a second input impedance measured at the input of the impedance matching network, wherein the second measured input impedance is measured when the output of the impedance matching network is connected to the input of the second fixture, wherein the processor is configured to apply the first measured output impedance at an output of a match network model to calculate a first predicted input impedance at an input of the match network model when the match network model is assigned a first frequency, a first variable capacitance, a first fixed inductance, a first fixed capacitance, and a first fixed resistance, wherein the processor is configured to apply the second measured output impedance at the output of the match network model to calculate a second predicted input impedance at the input of the match network model when the match network model is assigned a second frequency, a second variable capacitance, the first fixed inductance, the first fixed capacitance, and the first fixed resistance, wherein the processor is configured to determine whether the first predicted input impedance is within a predetermined range from the first measured input impedance and whether the second predicted input impedance is within the predetermined range from the second measured input impedance, wherein the processor is configured to assign the first fixed inductance, the first fixed capacitance, and the first fixed resistance to the match network model upon determining that the first predicted input impedance is within the predetermined range from the first measured input impedance and that the second predicted input impedance is within the predetermined range from the second measured input impedance; and
a memory device coupled to the processor.

11. The system of claim 10,
wherein the first measured input impedance is measured for the first variable capacitance of the impedance matching network when the input of the impedance matching network is connected to an output of a network analyzer operating at the first frequency,
wherein the processor is configured to determine whether the first measured input impedance is within a predetermined threshold of a predetermined impedance,
wherein the processor is configured to store within the memory device the first frequency and the first variable capacitance upon determining that the first measured input impedance is within the predetermined threshold of the predetermined impedance,
wherein the second measured input impedance is measured for the second variable capacitance of the impedance matching network when the input of the impedance matching network is connected to the output of the network analyzer operating at the second frequency,
wherein the processor is configured to determine whether the second measured input impedance is within the predetermined threshold of the predetermined impedance, and
wherein the processor is configured to store the second frequency and the second variable capacitance in the memory device upon determining that the second measured input impedance is within the predetermined threshold of the predetermined impedance.

12. The system of claim 10, wherein the first measured input impedance is measured by a network analyzer, wherein the first measured input impedance is a complex value, wherein the input of the impedance matching network is configured to be coupled to a branch circuit of the impedance matching network, wherein the branch circuit is configured to be coupled to an RF generator during processing of a wafer.

13. The system of claim 10,
wherein the first measured input impedance is measured for the first variable capacitance of the impedance matching network when the input of the impedance matching network is connected to an output of a network analyzer operating at the first frequency,
wherein the first variable capacitance of the impedance matching network is a combined variable capacitance of one or more variable capacitors of the impedance matching network,
wherein the second measured input impedance is measured for the second variable capacitance of the impedance matching network when the input of the impedance matching network is connected to the output of the network analyzer operating at the second frequency,
wherein the second variable capacitance of the impedance matching network is a combined variable capacitance of the one or more variable capacitors of the impedance matching network.

14. A system for using multiple fixtures for applying a variety of plasma conditions to determine fixed parameters of a match network model, comprising:
an impedance matching network having an input and an output;
a first fixture;
a network analyzer,
wherein the impedance matching network is not connected to a radio frequency (RF) generator,
wherein the network analyzer is configured to measure a first output impedance at an input of the first fixture when the first fixture is connected to the network analyzer,
wherein the network analyzer is further configured to measure a first input impedance at an input of the network analyzer when the network analyzer is connected to the impedance matching network and the impedance matching network is connected to the first fixture;
a processor connected to the network analyzer,
wherein the processor is configured to receive the first measured output impedance and the first measured input impedance from the network analyzer,
a second fixture,
wherein the network analyzer is configured to measure a second output impedance at an input of the second fixture when the network analyzer is connected to the second fixture,
wherein the network analyzer is further configured to measure a second input impedance at the input of the network analyzer when the second fixture is connected to the impedance matching network and the network analyzer is connected to the impedance matching network,
wherein the processor is configured to receive the second measured output impedance and the second measured input impedance from the network analyzer,
wherein the processor is configured to apply the first measured output impedance at an output of a match network model to calculate a first predicted input impedance at an input of the match network model when the match network model is assigned a first frequency, a first variable capacitance, a first fixed inductance, a first fixed capacitance, and a first fixed resistance,
wherein the processor is configured to apply the second measured output impedance at the output of the match network model to calculate a second predicted input impedance at the input of the match network model when the match network model is assigned a second frequency, a second variable capacitance, the first fixed inductance, the first fixed capacitance, and the first fixed resistance,
wherein the processor is configured to determine whether the first predicted input impedance is within a predetermined range from the first measured input impedance and whether the second predicted input impedance is within the predetermined range from the second measured input impedance,
wherein the processor is configured to assign the first fixed inductance, the first fixed capacitance, and the first fixed resistance to the match network model upon determining that the first predicted input impedance is within the predetermined range from the first measured input impedance and that the second predicted input impedance is within the predetermined range from the second measured input impedance.

15. The system of claim 14,
wherein the first measured input impedance is measured for the first variable capacitance of the impedance matching network when the input of the impedance matching network is connected to an output of the network analyzer operating at the first frequency,
wherein the processor is configured to determine whether the first measured input impedance is within a predetermined threshold of a predetermined impedance;

wherein the processor is configured to store the first frequency and the first variable capacitance in a memory device upon determining that the first measured input impedance is within the predetermined threshold of the predetermined impedance, wherein the second measured input impedance is measured for the second variable capacitance of the impedance matching network when the input of the impedance matching network is connected to the output of the network analyzer operating at the second frequency, wherein the processor is configured to determine whether the second measured input impedance is within the predetermined threshold of the predetermined impedance, wherein the processor is configured to store the second frequency and the second variable capacitance in the memory device upon determining that the second measured input impedance is within the predetermined threshold of the predetermined impedance.

16. The system of claim 14, wherein the first measured input impedance is a complex value, wherein the input of the impedance matching network is configured to be coupled to a branch circuit of the impedance matching network, wherein the branch circuit is configured to be coupled to the RF generator during processing of a wafer.

17. The system of claim 14, wherein the first measured input impedance is measured for the first variable capacitance of the impedance matching network when the input of the impedance matching network is connected to an output of the network analyzer operating at the first frequency, wherein the first variable capacitance of the impedance matching network is a combined variable capacitance of one or more variable capacitors of the impedance matching network.

18. The system of claim 14, wherein the network analyzer is configured to measure the first input impedance when the network analyzer is operated at the first frequency and the impedance matching network has the first variable capacitance, wherein the network analyzer is configured to measure the second input impedance when the network analyzer is operated at the second frequency and the impedance matching network has the second variable capacitance.

* * * * *